(12) United States Patent
Balachandran et al.

(10) Patent No.: US 11,870,309 B2
(45) Date of Patent: Jan. 9, 2024

(54) MOTOR AND MOTOR DRIVE ARRANGEMENT

(71) Applicant: Hamilton Sundstrand Corporation, Charlotte, NC (US)

(72) Inventors: Ajith Balachandran, Solihull (GB); Thilak Durairaj, Solihull (GB); Mark Downes, West Midlands (GB); Edward G C Pocock, Milton Keynes (GB); Ashishkumar Parekh, Staffordshire (GB); Kalyani Menon, Solihull (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/592,880

(22) Filed: Feb. 4, 2022

(65) Prior Publication Data
US 2022/0255406 A1    Aug. 11, 2022

(30) Foreign Application Priority Data

Feb. 8, 2021    (EP) .................................... 21275013

(51) Int. Cl.
| | |
|---|---|
| *H02K 11/33* | (2016.01) |
| *H02K 9/22* | (2006.01) |
| *B64D 27/24* | (2006.01) |
| *H02K 11/02* | (2016.01) |
| *H02K 24/00* | (2006.01) |
| *H03H 1/00* | (2006.01) |

(52) U.S. Cl.
CPC ............. *H02K 11/33* (2016.01); *B64D 27/24* (2013.01); *H02K 9/227* (2021.01); *H02K 11/02* (2013.01); *H02K 24/00* (2013.01); *H03H 1/0007* (2013.01)

(58) Field of Classification Search
CPC ........ B64D 27/24; H03H 1/0007; H02K 9/22; H02K 9/227; H02K 11/02; H02K 11/33; H02K 24/00
USPC ......................................... 310/52, 54, 58, 64
See application file for complete search history.

(56) References Cited

U.S. PATENT DOCUMENTS

| | | |
|---|---|---|
| 5,763,969 A | 6/1998 | Metheny et al. |
| 6,611,071 B2 | 8/2003 | Stauder et al. |
| 7,362,017 B2 | 4/2008 | Piper et al. |
| 8,593,808 B2 | 11/2013 | Pal et al. |
| 8,968,042 B2 * | 3/2015 | Calverley .............. B63H 23/24 310/46 |
| 9,178,400 B2 | 11/2015 | Pal et al. |

(Continued)

FOREIGN PATENT DOCUMENTS

JP         2020025450 A      2/2020

OTHER PUBLICATIONS

Abstract for JP2020025450 (A), 2 Pages.
European Search Report for Application No. 21275013.7, dated Jul. 7, 2021, 7 Pages.

*Primary Examiner* — Rashad H Johnson
(74) *Attorney, Agent, or Firm* — CANTOR COLBURN LLP

(57) ABSTRACT

An integrated motor and motor drive arrangement includes a motor having a stator, and a rotor, rotatable relative to the stator to drive a load, the rotor being arranged radially outside the stator, and the stator having an inner surface defining a radially inner space, the motor arrangement further comprising: motor drive components mounted to the inner surface of the stator within the radially inner space.

13 Claims, 9 Drawing Sheets

(56) References Cited

U.S. PATENT DOCUMENTS

| | | |
|---|---|---|
| 9,531,239 B2 | 12/2016 | Maschke et al. |
| 11,462,980 B2* | 10/2022 | Lu .......................... B64C 11/48 |
| 2004/0266277 A1* | 12/2004 | Ries ....................... B63H 23/24 |
| | | 440/6 |
| 2005/0104460 A1* | 5/2005 | Kusase ................... H02K 9/04 |
| | | 310/58 |
| 2010/0164428 A1* | 7/2010 | Xu .......................... F01D 15/10 |
| | | 310/211 |
| 2013/0049495 A1* | 2/2013 | Matsuo ............... G06F 16/1748 |
| | | 310/59 |
| 2013/0082550 A1* | 4/2013 | Fleming ................. H02K 5/132 |
| | | 310/63 |
| 2016/0211728 A1 | 7/2016 | Yin et al. |
| 2019/0074751 A1* | 3/2019 | Chen ................... H02K 11/215 |
| 2019/0245414 A1* | 8/2019 | Barrass .................. H02K 11/33 |
| 2019/0273421 A1* | 9/2019 | Velderman .............. H02K 5/18 |
| 2020/0007007 A1 | 1/2020 | Haran |
| 2020/0014285 A1* | 1/2020 | Chang ................... H02K 5/207 |
| 2020/0164735 A1 | 5/2020 | Van Der Wal et al. |
| 2020/0177054 A1 | 6/2020 | Van Seventer et al. |
| 2020/0328639 A1* | 10/2020 | Takahashi ............ H02K 1/2791 |
| 2021/0107664 A1* | 4/2021 | Rabbi ...................... H02K 7/14 |
| 2021/0288531 A1* | 9/2021 | Takahashi ............ H02K 5/1675 |
| 2021/0288553 A1* | 9/2021 | Day ........................ H02K 9/06 |
| 2021/0317835 A1* | 10/2021 | Sawata .................... H02K 9/00 |
| 2021/0344255 A1* | 11/2021 | Said ....................... H02K 5/225 |
| 2022/0009643 A1* | 1/2022 | Datta ...................... H02K 3/28 |
| 2022/0009644 A1* | 1/2022 | Rabbi .................... B64D 29/00 |
| 2022/0021267 A1* | 1/2022 | Takahashi .............. H02K 5/203 |
| 2022/0029488 A1* | 1/2022 | Belzile .................... H02K 1/27 |
| 2022/0173649 A1* | 6/2022 | Semik ................... H02K 55/02 |
| 2022/0185452 A1* | 6/2022 | Saber ..................... B64D 27/24 |
| 2022/0200408 A1* | 6/2022 | Takahashi ........ H02K 11/0141 |
| 2022/0216760 A1* | 7/2022 | Takahashi ............. H02K 21/14 |
| 2022/0238779 A1* | 7/2022 | Chong .................... H02K 9/19 |
| 2022/0239199 A1* | 7/2022 | Salam .................... H02K 11/33 |
| 2022/0263384 A1* | 8/2022 | Kapatral .................. H02K 1/32 |
| 2022/0360129 A1* | 11/2022 | Salk ....................... H02K 9/227 |

* cited by examiner

Modules are located to allow symmetrical neat flow to the coolant.

Connection to DC bus bars.

MOTOR AND MOTOR DRIVE ARRANGEMENT

CROSS-REFERENCE TO RELATED APPLICATIONS

This application claims priority to European Patent Application No. 21275013.7 filed Feb. 8, 2021, the entire contents of which is incorporated herein by reference.

TECHNICAL FIELD

The present disclosure is concerned with an integral motor and motor drive arrangement.

BACKGROUND

Electric motors are used in many applications to convert electrical energy to mechanical energy and vice versa. Motors typically comprise a rotor that rotates relative to the stator. For a permanent magnet machine, typically windings are provided on the stator with permanent magnets provided on the rotor. As the rotor rotates relative to the stator, magnetic fields are created which generate torque on a rotor shaft to drive a mechanical load e.g. a fan or propeller.

Electric motors are often used in vehicles and aircraft e.g. in a turbofan assembly or other propulsion assembly, to drive a fan or propeller.

A control system is required to operate the motor. The control system includes power conversion and control circuitry including inverters, converters and the like as is known in the art.

Because of the high power requirements, it is important to cool the motor. Cooling of the control system is also usually required to avoid damage to, and prolong the life of the components.

Cooling of motor components may be performed by e.g. use of liquid or gas coolant. Fans, water cooling systems, heat sinks and heat exchangers are also known for cooling control circuitry.

Such motor structures can be large and heavy due to the need for the motor components, the control components and their respective cooling systems. In aircraft, for example, additional space is required in the fuselage for the motor drive unit. In addition, cables between the motor and the motor drive unit are often long and contribute to significant transmission line effects which also results in increased aircraft weight.

In fields where space is at a premium, e.g. in the aerospace and automotive industries, motor control systems have been designed in which the motor components and the control circuitry are integrated into a single package or unit, thus providing a more compact arrangement. Integrated motor and control system packages are known from e.g. US 2020/0007007, U.S. Pat. Nos. 5,763,969, 6,611,071, 7,362,017, 8,593,808, 9,178,400 and 9,531,239. Generally, the control circuitry is arranged axially adjacent (in front or behind) the motor or on the top or the outside of the motor.

There is a need for a motor control system that is optimised in terms of power density, without compromising efficiency, particularly in aerospace and automobile applications.

SUMMARY

According to the disclosure, there is provided an integrated motor and motor drive arrangement comprising: a motor having a stator and a rotor, rotatable relative to the stator to drive a load, the rotor being arranged radially outside the stator, and the stator having an inner surface defining a radially inner space, the motor arrangement further comprising: motor drive components mounted to the inner surface of the stator within the radially inner space.

The motor drive components may include power converters, e.g. power converter modules, DC capacitors, DC buses, filters, resolvers and other components.

A cooling arrangement, common to the motor and the motor drive components may also be provided.

The arrangement may be used in a motor to drive a propeller e.g. an aircraft propeller but may also be used in other applications.

DETAILED DESCRIPTION

The described embodiments are by way of example only. The scope of this disclosure is limited only by the claims.

Figure 1:
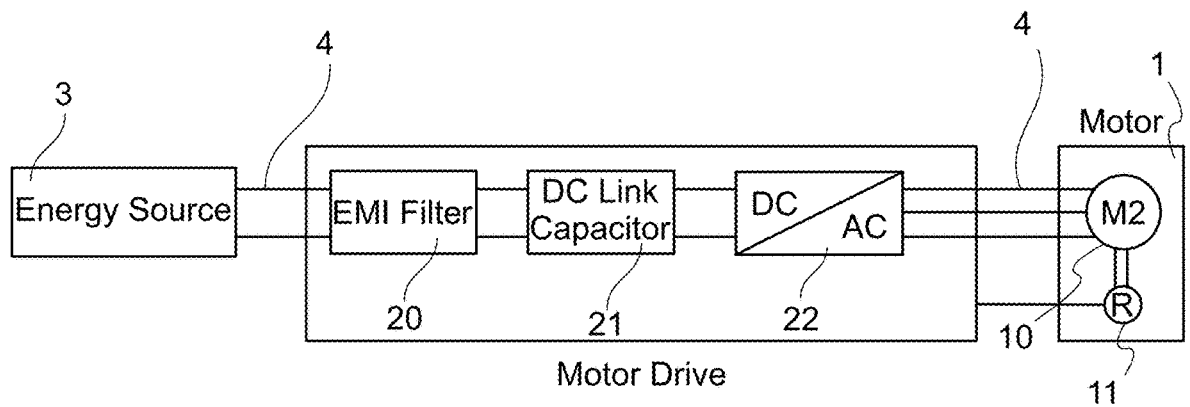
FIG. 1 shows, for the purpose of explanation, a conventional motor and motor drive arrangement.

First, by way of brief background, reference is made to FIG. 1 which shows the design of a conventional motor and motor drive assembly.

The electric motor 1, having a rotor and stator unit 10 and, usually, a resolver 11 to provide position feedback, is driven by means of a motor drive 2 powered by an energy source. The motor drive 2 converts the power from the energy source 3 to power suitable for driving the motor 1. The main components of the motor drive 2 are an EMI filter 20, a DC link capacitor 21, a controller and an inverter or rectifier power stage 22. Conventionally, as mentioned above, the motor 1 is located locally to the load to be driven e.g., in an aircraft, a propeller (not shown) and the energy source 3 and motor drive 2 are located at a different location, e.g. the motor drive 2 may be located in the aircraft fuselage and be connected to the motor 1 by power cables and control cables 4. Such an arrangement requires space for the motor drive in addition to the space required for the motor and, further, the cables can introduce transmissions line effects.

The assembly of this disclosure uses a motor having an inner stator and outer rotor, rather than an inner rotor. Because the rotor is mounted around the outside of the stator rather than in the stator interior, the inner space defined by the stator can be utilised to mount the motor drive components. In addition, cooling can be provided in this space to cool both the motor and the motor drive components.

The motor is controlled, by a motor drive, to drive a load e.g. a propulsive component (not shown).

Figure 2:
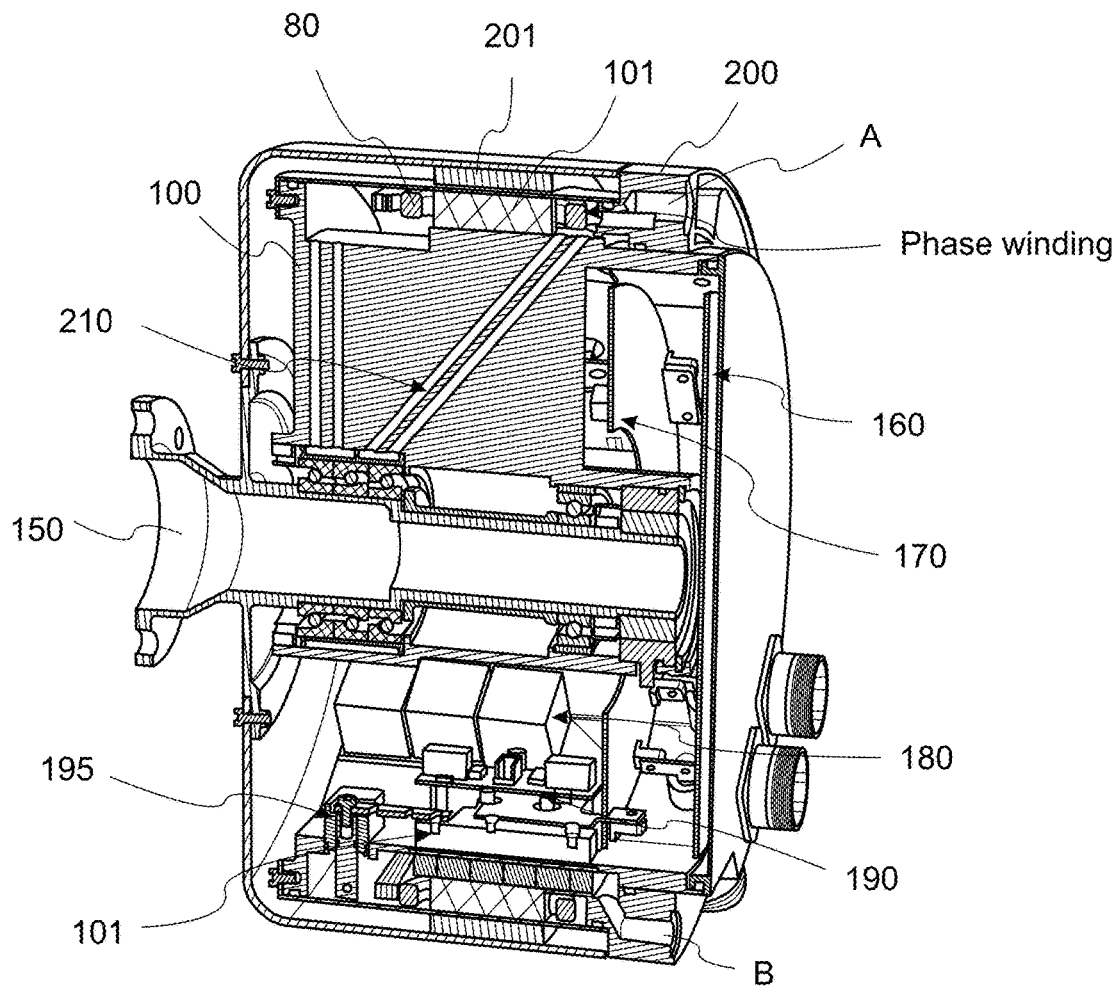
FIG. 2 is a sectional view of an integrated motor and motor drive arrangement according to the disclosure.

Example of an assembly according to this disclosure will be described in broad terms with reference to FIGS. 2 and 3, and then in more detail with reference to FIGS. 4 to 18.

According to the disclosure, the stator 100 is mounted around the motor shaft 150. The rotor 200 is mounted around the stator 100. The rotor 200 is fixed relative to the motor shaft 150 to rotate the shaft with rotation of the rotor. The stator phase windings 101 are provided on the outside of the stator core. The windings generate a rotating magnetic field which induces current in the rotor windings or permanent magnets 201 mounted on the inside of the rotor body, i.e. facing in towards the stator windings. The induced current causes rotation of the rotor. The operation of an outer rotor motor is already known to those skilled in the art and will not be described in further detail.

As mentioned above, a motor drive is required to provide appropriate power to drive the motor from the energy source. The motor drive has various filter and power conversion components including controller circuitry e.g. on a controller board 160, a filter board 170, DC link capacitors 180, gate drivers 190 and phase connectors 195 from the AC supply to the motor phase windings 101. The various components of a motor drive are known in the art. In the assembly according to this disclosure, unlike in the known designs, the motor drive components are mounted in the interior space defined by the stator body. This will be described further below.

In addition to the motor drive components, a cooling assembly may also be provided inside the motor, whereby coolant is channelled, 210, to provide cooling to the windings and also to the motor drive components. Again, this will be described further below In one example, as shown in FIG. 2, the cooling is provided by a liquid coolant that is directed through channels 210 to provide cooling without allowing fluid to contact the electrical parts of the motor drive system.

Figure 3:
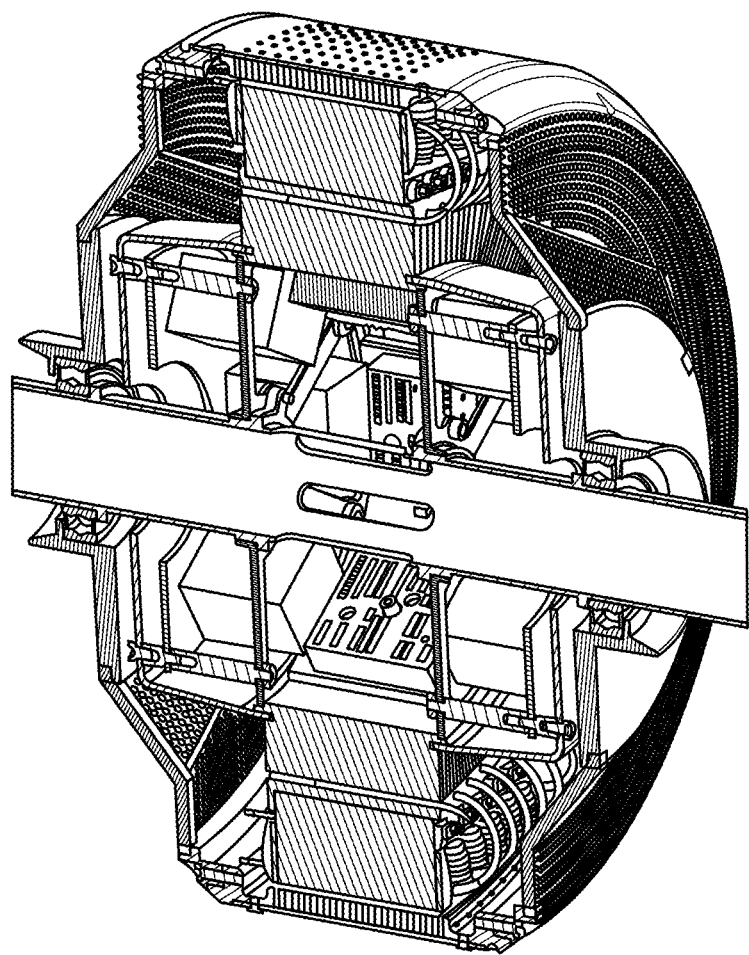
FIG. 3 is a sectional view of an integrated motor and motor drive arrangement according to another example of the disclosure.

In another example, cooling can be provided by airflow as in the example shown in FIG. 3.

Referring now to FIGS. 4 to 18, an example of an assembly according to the disclosure will now be described in more detail.

Figure 4B:
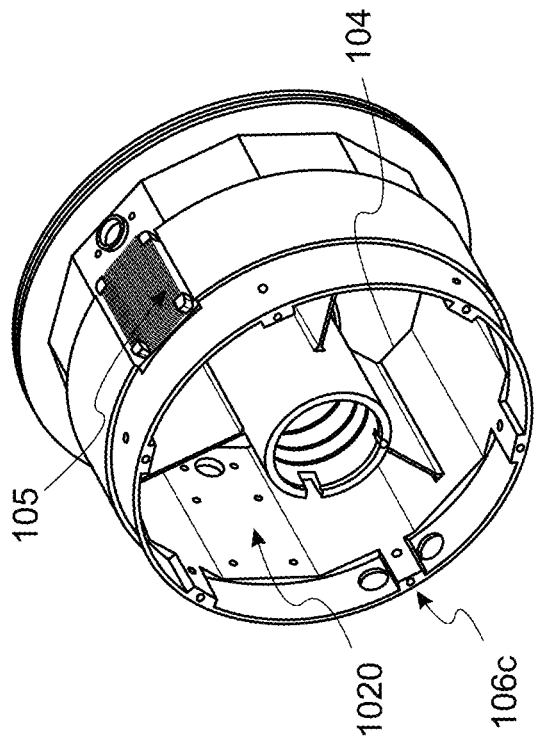
FIG. 4B shows the first step in assembling an integrated motor and motor drive assembly according to the disclosure, shown from a non-drive end or rear face of the assembly.
Figure 4A:
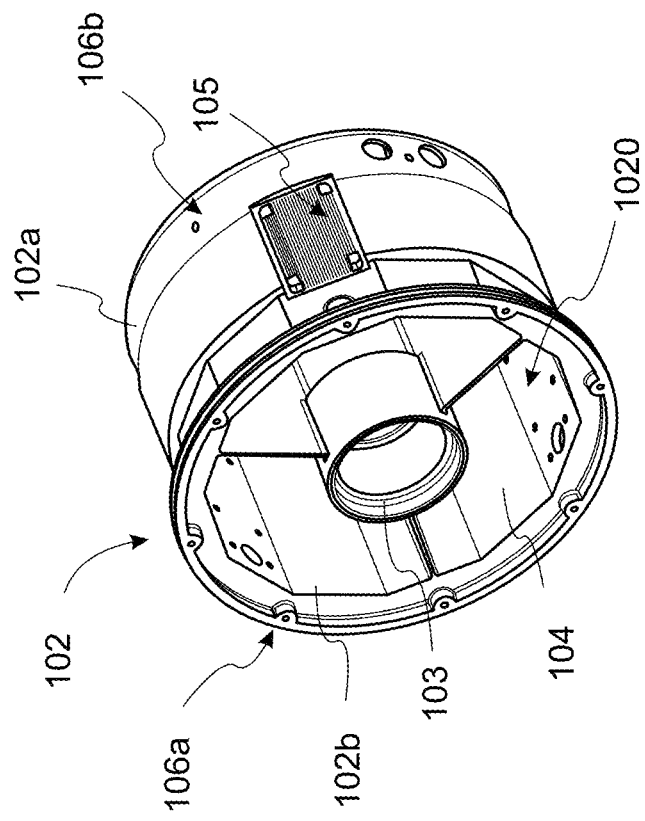
FIG. 4A shows an integrated motor and motor drive assembly according to the disclosure, shown from a drive end or front face of the assembly.

The starting point, shown from front and rear perspectives in FIGS. 4A and 4B, is the stator housing 102 designed with a fitting 103 to fit around the motor shaft 150. The stator housing 102 has an outer surface 102a and an inner surface 102b, the inner surface defining an interior space 104. The inner surface 102b is machined such that motor drive components can be mounted onto the inner surface. In the example shown, the inner surface is machined with flat sections or panels 102 to facilitate mounting of components thereto. In one example, to improve cooling of the motor, heatsink 105 can be mounted to the stator housing. In this example, these are mounted to the outer surface 102a of the stator housing. It is envisaged that heatsink 105 could be provided at different locations. The cooling oil in the heatsink 105, which is, in this embodiment, a structure of cooling fins, acts to cool the inverters mounted on the stator. In addition, the heat sink will cool the back iron of the stator to which it is mounted.

In some cases, heat sinks may not be required. Depending on the components to be mounted to the stator, and the type of mounting, holes of various sizes 106a, 106b, 106c can be machined into the housing.

The motor drive components are then mounted to the inner surface 102b, and in the interior space 104 of the stator.

Figure 6:
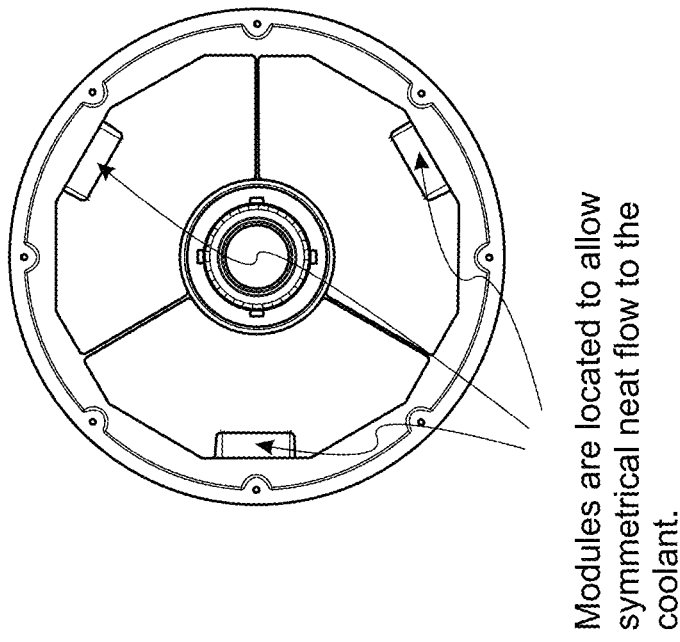
FIG. 6 shows an example of the location of power modules.
Figure 5:
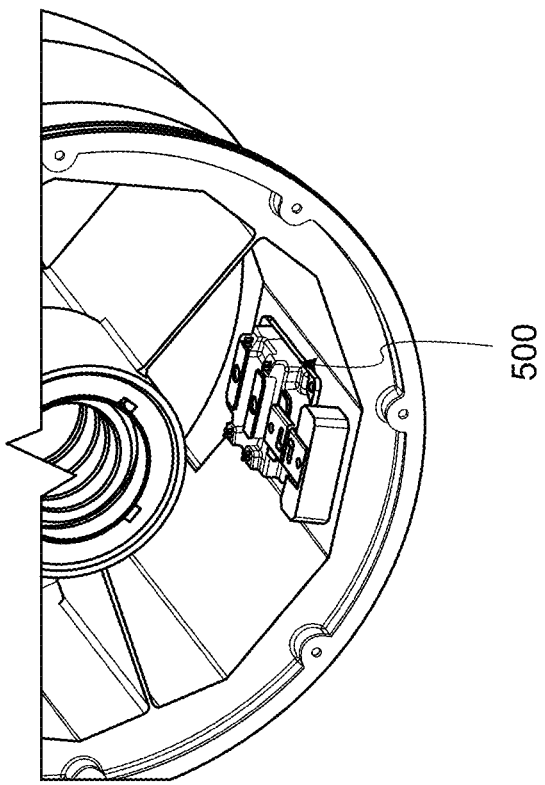
FIG. 5 shows an example of installation of power modules in assembling an integrated motor and motor drive assembly according to the disclosure.

The power converter components, e.g. the rectifiers, inverters, will usually be provided in the form of a module. In a first step, the power modules 500 are mounted to the inner surface of the stator housing. Connectors (not shown) will be provided for connection to the AC energy source and, optionally, shunt current sensors (not shown) may also be mounted with or integrated into the power modules. Optionally, current sensors in the form of Hall effect sensors may be provided. The number of power modules and their location and distribution around the stator housing inner surface will depend on the use of the motor. Preferably, the motor drive components will be provided in several modules and located around the stator in an even distribution to allow symmetrical heat dispersion, as shown in FIG. 6. In an example, the inverters can be mounted to a heatsink.

Figure 7:
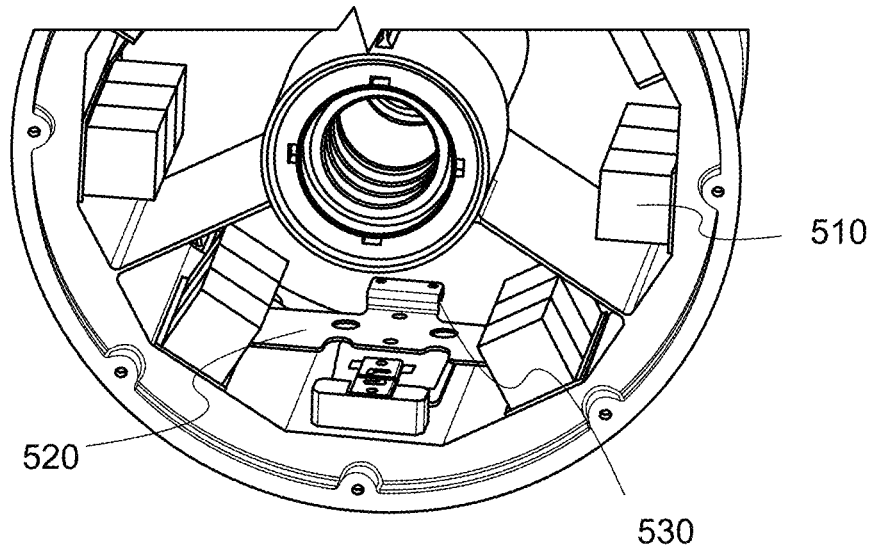
FIG. 7 shows an example of installation of DC capacitors in assembling an integrated motor and motor drive assembly according to the disclosure.

As shown in FIG. 7, the DC link capacitors 510 are then mounted to the inner surface and are connected by DC link bus bars 520 to the power modules 500. The DC capacitors may be connected to the bus bars by e.g. soldering or welding or any other known form of electrically conductive connection. In one example, the DC link bus bars 520 can be laminated multilayer bus bars having positive and negative connections to the power module 500. The bus bar may also be provided with an extension 530 for connection to other components e.g. the input filter.

Figure 8:
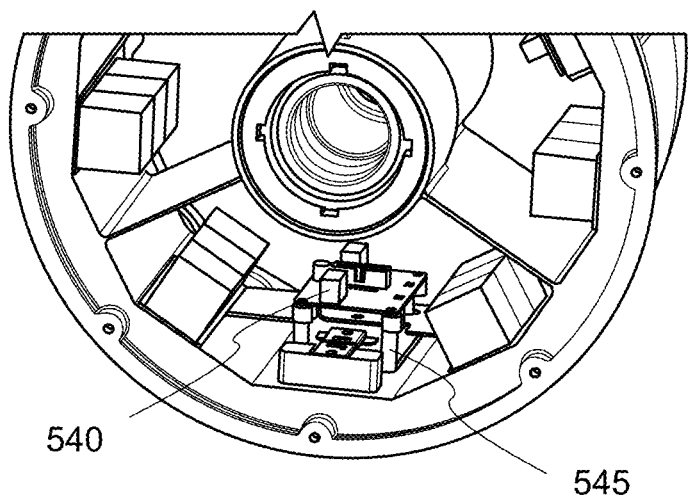
FIG. 8 shows an example of connection of gate drives in assembling an integrated motor and motor drive assembly according to the disclosure.
Figure 9:
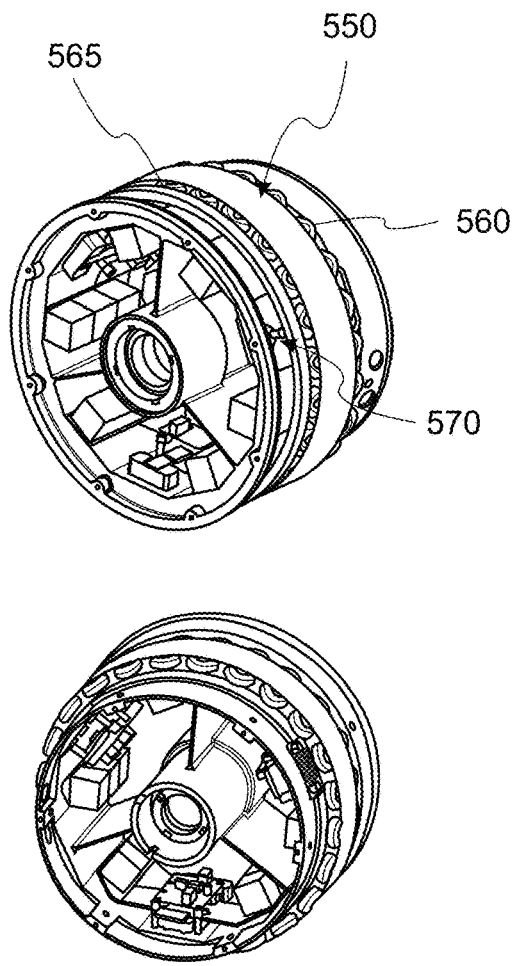
FIG. 9 shows an example of assembling further components in assembling an integrated motor and motor drive assembly according to the disclosure.
Figure 10:
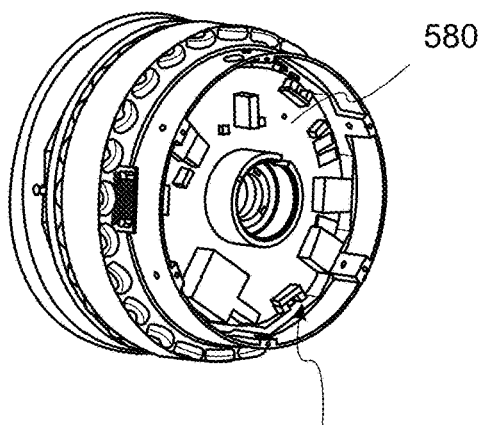
FIG. 10 shows an example of assembling further components in assembling an integrated motor and motor drive assembly according to the disclosure.

In a next step, shown in FIG. 8, the gate drives 540 for the power converter are connected to the power modules 500. For a more compact arrangement, the gate drives 540 may be assembled over, but spaced, e.g. by a stand-off spacer 545, from, the DC link bus bars 520. The gate drives are switched by signals from the motor controller (not shown) to control power distribution. The connection between the gate driver and the controller may be by means of leads e.g. flying leads, that exit the motor, preferably via the non-drive end. The gate drives are preferably provided on a gate drive board and may also be used for local current sensing.

The stator core 550 onto which the stator windings 201, 560 are mounted and circular bus bars 565 form a stator core pack that is fitted onto the stator housing inside which the motor drive components are assembled e.g. as shown in FIG.

9. Means should be provided to locate and secure the stator core pack onto the stator housing. This may be by means of slots/detents, keys/keyway slots etc. as is known in the art. Alternatively, the stator core can be form fitted or shrink fitted onto the stator housing. The stator core pack can be formed as a complete ring or can be formed in segments and mounted to the stator housing. The stator core pack is then connected to terminals or connectors 570 for connection to the AC load. The stator windings are as known in the art and can be e.g. solid copper wires or Litz wires.

As mentioned above, the motor drive usually also includes EMI or other input filters 20. These are also mounted inside the stator housing. In the example shown in FIG. 10, the filters are provided on a filter card 580 mounted across the interior space and connected to the DC bus bars 520 to connect the power module 500 and the filter board 580. In the example shown, the filter mounted can be configured to connect the DC link capacitors 510 together. For high current machines, the filter board can be a heavy copper PCB. Alternatively, the filter components could be located on a cold plate to provide additional cooling.

Figure 11A:
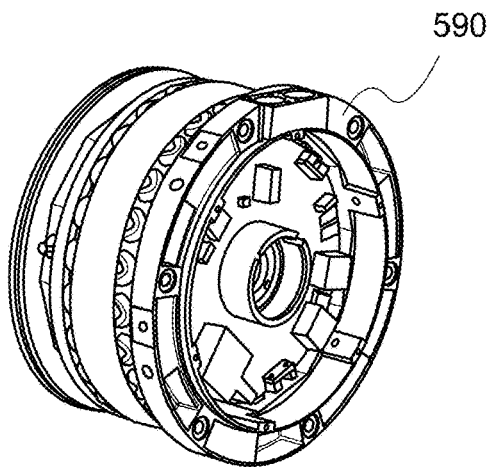
FIG. 11A shows an example of assembling an oil manifold in assembling an integrated motor and motor drive assembly according to the disclosure.
Figure 11B:
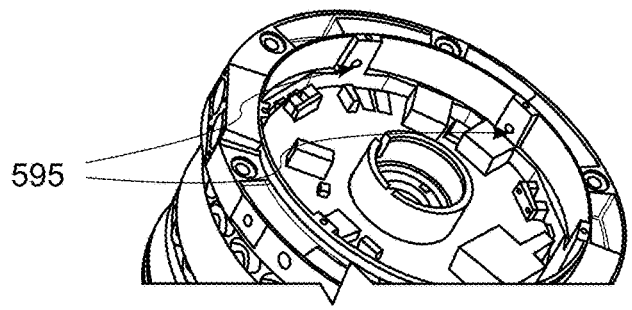
FIG. 11B is a detail of FIG. 11A
Figure 12:
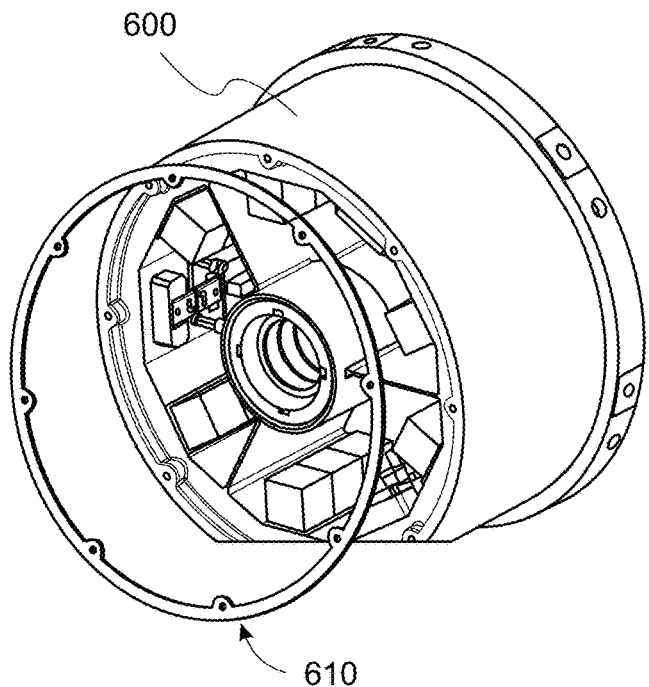
FIG. 12 shows an example of assembling a sleeve in assembling an integrated motor and motor drive assembly according to the disclosure.

An oil manifold 590 may also be mounted to the housing as shown in FIGS. 11A and 11B. Attachment means such as pins or holes and screws 595 may be provided for locating the oil manifold.

As is known in outer rotor motors, a sleeve 600, such as a carbon fibre sleeve, is provided over the stator housing outer surface. In the example shown in FIG. 12, the sleeve 600 is pushed over the housing to abut against and be held by the oil manifold 590. The sleeve may be held in place at the other end e.g. b a clamp ring or plate 610. The sleeve should be fitted so as to ensure that oil cannot leak from the stator into the air gap between the stator and the rotor. O-rings/seals (not shown) will also ensure that leaks are avoided.

Figure 15:
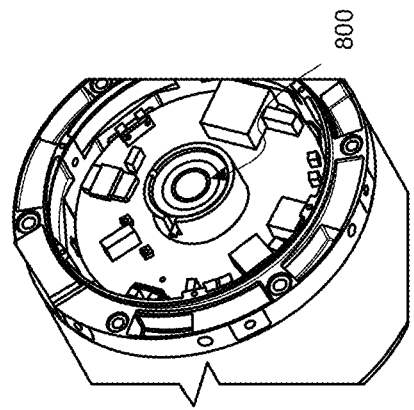
FIGS. 15 to 17 show an example of assembling further components in assembling an integrated motor and motor drive assembly according to the disclosure.
Figure 14:
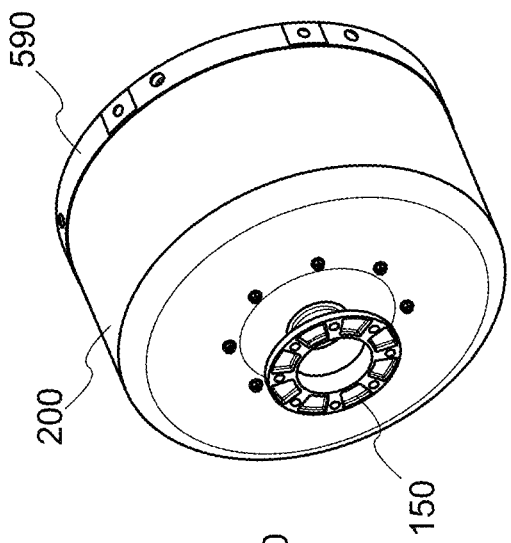
FIG. 14 is a perspective view of the assembled stator and rotor according to the disclosure.
Figure 13:
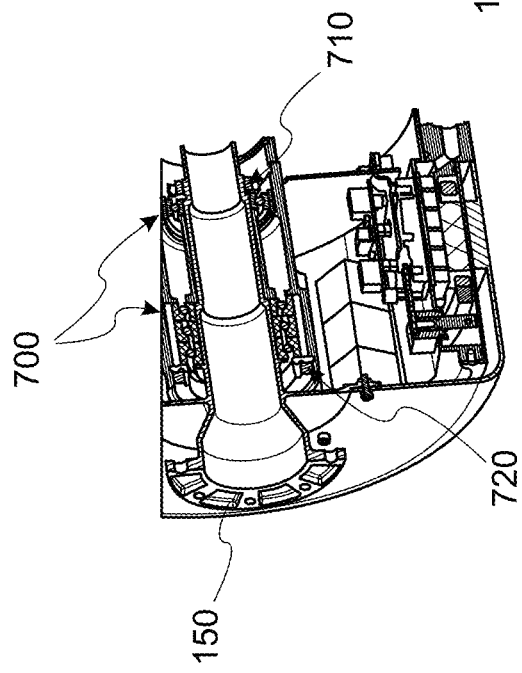
FIG. 13 shows an example of assembling the bearing and rotor in assembling an integrated motor and motor drive assembly according to the disclosure.

Bearings 700 are then mounted to the stator for mounting to the motor shaft 150. The bearings may be secured in place in any known manner. In the example sown in FIG. 13, they are secured by a locking nut 710 and locking nut bearing 720. The outer rotor 200 is then installed over the stator 100. The structure of the rotor can be any of the known designs for an outer rotor. In one example, the rotor is a carbon fibre rotor with permanent magnets 101 bonded to the carbon fibre rotor body.

Where a resolver 800 is required e.g. for position feedback, this may be assembled around the motor shaft 150 as shown in FIG. 15.

Figure 18:
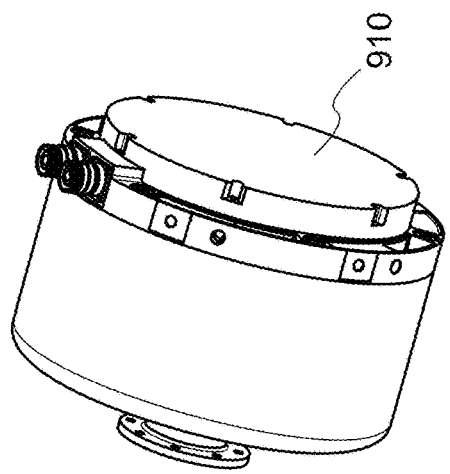
FIG. 18 is a perspective view of an integrated motor and motor drive assembly according to the disclosure.
Figure 17:
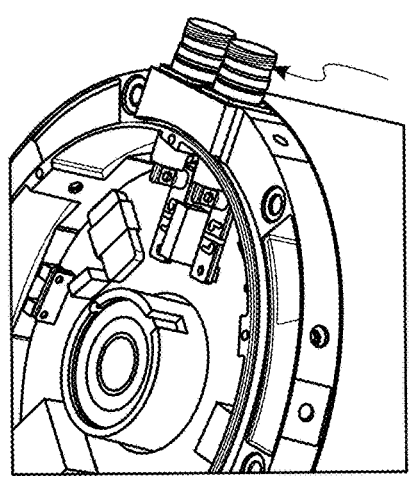
Figure 16:
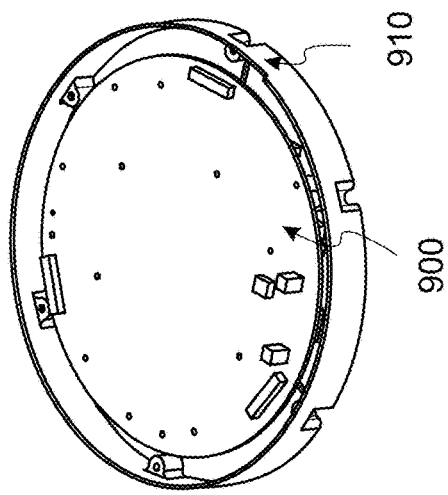

The motor controller can also be integrated into the motor. The motor controller may be configured on a motor controller PCB 900. This can be assembled in the motor e.g. on the motor end cap 910 as shown in FIG. 16. DC connectors 920 can also be machined into the end cap or oil manifold to provide a DC output, as shown in FIG. 17. In addition, airframe connectors can be provided (not shown) in a manner similar to the DC connectors to allow a system controller located outside the integrated unit to provide commands to the motor controller card. The end cap 910 is then fitted onto the motor over the oil manifold. FIG. 18 shows the completed compact motor with integrated motor drive.

As mentioned above, the motor may also be provided with integrated cooling that cools both the motor and the motor drive components. The integrated motor and motor drive configuration makes this shared cooling possible. As described above with reference to FIG. 4, heat sinks can be provided on the stator that provide cooling for the motor and the motor drive components. In addition, shared active cooling in the form of air or liquid cooling may be provided. In the case of liquid cooling, cooling liquid e.g. oil is provided via the oil manifold 590. Oil flows in through port A and flows through the power module heatsink then around the windings to cool the windings. Seals 80 prevent the oil from flowing into the interior space where the electronic components of the motor drive are located. The oil is directed to cool the bearings 700 via channels 210, the channels and the path around the windings forming a closed loop for the cooling fluid. Oil exits at port B. The oil manifold 590 is preferably a replaceable unit—i.e. the oil manifold can be separately replaced rather than having to replace the whole motor assembly.

In an air cooled example, as shown in FIG. 3, air is flowed through the interior of the motor to cool the motor and motor drive components. Air generated to the load e.g. the propulsive component can be used as cooling air.

Although an example of an assembly has been described in detail, variations are possible within the scope of the claims. Different components may be provided in the interior space, depending on the use of the motor. The order in which the components are assembled may also be varied.

The design of the motor assembly, in integrating the motor drive components in the interior space of the rotor, which is enabled by having an outer rotor, maximises the power density of the system and provides a compact assembly that can be mounted locally e.g. at an aircraft propeller, without the need to locate the motor drive separately and also without the need for cabling that gives rise to transmission line effects. The assembly also allows shared cooling between the motor and the motor drive components. The arrangement can also allow the DC link voltage to be used for more functions when the DC ports are provided. Because of the integral design, the filtering requirements are also reduced.

The above description is by way of example only and the scope of the invention is as defined by the claims.

The invention claimed is:

1. An integrated motor and motor drive arrangement comprising:
    a motor having:
        a stator; and
        a rotor, rotatable relative to the stator to drive a load, the rotor being arranged radially outside the stator, and the stator having an inner surface defining a radially inner space, the inner surface machined to define a plurality of interior flat panels;
    the motor arrangement further comprising:
    motor drive components mounted to the interior flat panels of the inner surface of the stator within the radially inner space, the motor drive components including:
    power converter components arranged in one or more power converter modules each mounted to a respective interior flat panel of the inner surface of the stator;
    one or more DC link capacitors each mounted to a respective one of interior flat panels adjacent a flat panel on which a power converter module is mounted, the one or more DC link capacitors connected to respective power converter modules by DC link bus bars and a gate drive for each of the one or more power converter modules, each gate drive assembled over but radially spaced from the respective DC link bus bar.

2. The arrangement of claim 1, further comprising:
    cooling means being common to the motor and the motor drive components.

3. The arrangement of claim 2, wherein the cooling means comprises one or more heat sinks located on the stator.

4. The arrangement of claim 3, wherein the one or more heat sinks are located on an outer surface of the stator.

5. The arrangement of claim 2, wherein the cooling means further includes coolant flow channels for directing a coolant fluid around the stator.

6. The arrangement of claim 5, wherein the coolant fluid is one of air, water, glycol, oil, fuel or refrigerant.

7. The arrangement of claim 1, wherein the power converter components are arranged in a plurality of modules distributed around the radially inner space.

8. The arrangement of claim 1, wherein the motor drive components further include filter means provided in the radially inner space.

9. The arrangement of claim 1, further comprising:
DC output ports to provide a DC output voltage from the motor drive components.

10. The arrangement of claim 1, further comprising:
motor control circuitry mounted in the radially inner space.

11. The arrangement of claim 1, further comprising:
a resolver mounted in the interior space.

12. The arrangement of claim 1, wherein the motor drive components include inverters.

13. A propeller system comprising:
a propeller; and
an integrated motor and motor drive arrangement as claimed in claim 1, the motor rotating the propeller and the propeller being the load.

* * * * *